(12) United States Patent
Jakovlev et al.

(10) Patent No.: US 9,764,941 B2
(45) Date of Patent: Sep. 19, 2017

(54) MICROMECHANICAL SENSOR DEVICE WITH MOVABLE GATE AND CORRESPONDING PRODUCTION METHOD

(71) Applicant: Robert Bosch GmbH, Stuttgart (DE)

(72) Inventors: Oleg Jakovlev, Stuttgart (DE); Alexander Buhmann, Reutlingen (DE); Ando Feyh, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 482 days.

(21) Appl. No.: 14/021,298

(22) Filed: Sep. 9, 2013

(65) Prior Publication Data

US 2014/0077272 A1    Mar. 20, 2014

(30) Foreign Application Priority Data

Sep. 17, 2012    (DE) .................. 10 2012 216 493

(51) Int. Cl.
*B81B 3/00* (2006.01)
*B81C 1/00* (2006.01)

(52) U.S. Cl.
CPC .......... *B81B 3/0018* (2013.01); *B81B 3/0086* (2013.01); *B81C 1/00134* (2013.01)

(58) Field of Classification Search
CPC . B81B 3/0018; B81B 3/0086; B81B 1/00134; H01L 29/84
USPC ........................................... 257/254; 438/50
See application file for complete search history.

(56) References Cited

U.S. PATENT DOCUMENTS

| | | | |
|---|---|---|---|
| 4,873,871 A | 10/1989 | Bai et al. | |
| 4,894,698 A | 1/1990 | Hijikigawa et al. | |
| 5,503,017 A * | 4/1996 | Mizukoshi | ................ 73/514.36 |
| 6,344,417 B1 | 2/2002 | Usenko | |
| 2002/0005530 A1* | 1/2002 | Heyers et al. | ................ 257/225 |
| 2006/0245034 A1 | 11/2006 | Chen et al. | |
| 2010/0149625 A1 | 6/2010 | Lu et al. | |
| 2011/0006382 A1 | 1/2011 | Nakatani | |

FOREIGN PATENT DOCUMENTS

| | | |
|---|---|---|
| CN | 1358276 A | 7/2002 |
| DE | 44 45 553 A1 | 6/1995 |
| EP | 0 990 911 A1 | 4/2000 |
| EP | 2 060 532 A2 | 5/2009 |
| EP | 2 060 533 A2 | 5/2009 |
| JP | 2010-123840 A | 6/2010 |
| JP | 2010-245278 A | 10/2010 |

* cited by examiner

*Primary Examiner* — David Vu
*Assistant Examiner* — Mouloucoulaye Inoussa
(74) *Attorney, Agent, or Firm* — Maginot, Moore & Beck LLP

(57) ABSTRACT

A micromechanical sensor device with a movable gate includes a field effect transistor having a drain region, a source region, a channel region arranged between the field effect transistor and the source region and including a first doping type, and a movable gate. The movable gate is separated from the channel region by an interspace. The drain region, the source region, and the channel region are arranged in a substrate. An oxide region is provided in the substrate at least at longitudinal sides of the channel region.

6 Claims, 2 Drawing Sheets

(A-A')

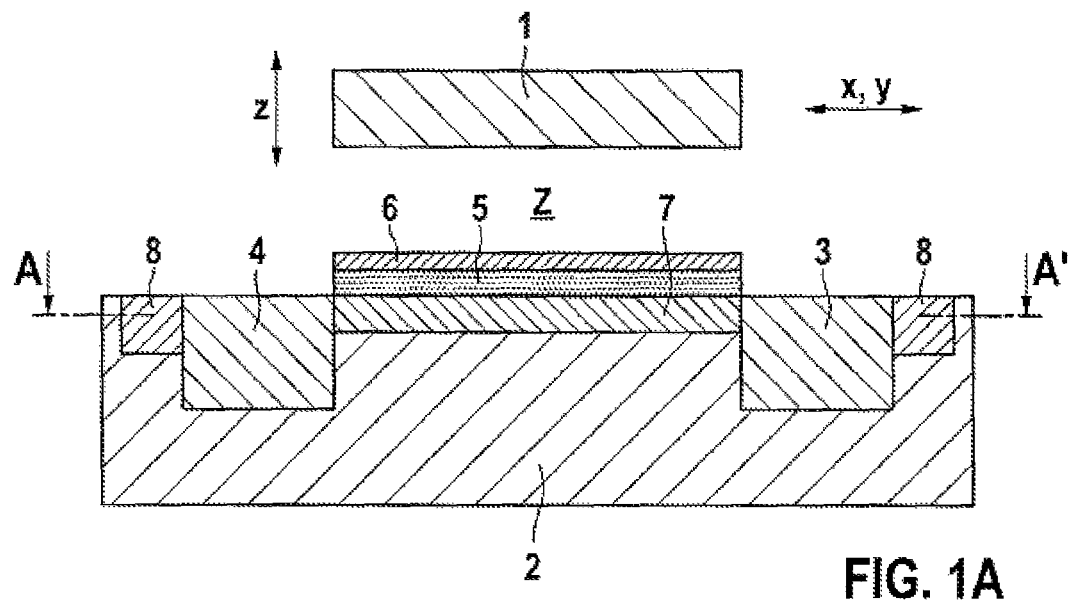
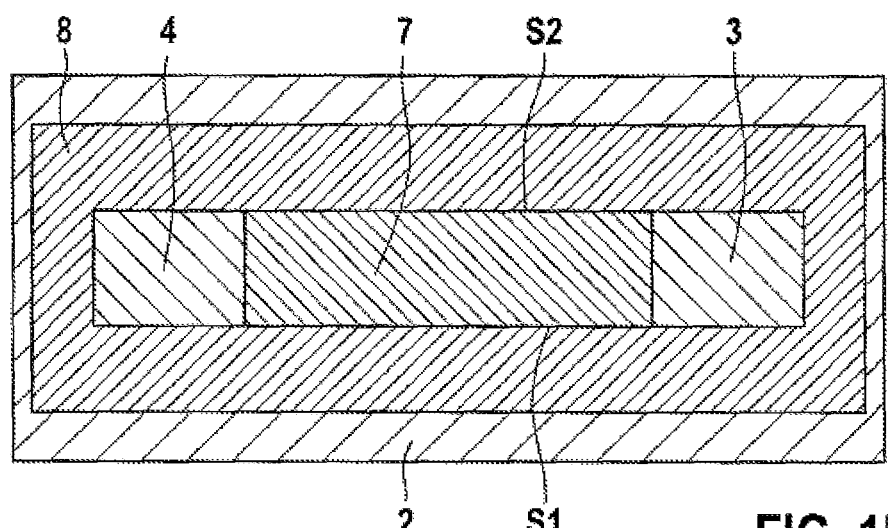

MICROMECHANICAL SENSOR DEVICE WITH MOVABLE GATE AND CORRESPONDING PRODUCTION METHOD

This application claims priority under 35 U.S.C. §119 to patent application no. DE 10 2012 216 493.6, filed on Sep. 17, 2012 in Germany, the disclosure of which is incorporated herein by reference in its entirety.

BACKGROUND

The disclosure relates to a micromechanical sensor device with movable gate and a corresponding production method.

Although applicable to any micromechanical components, the present disclosure and the problem addressed thereby are explained on the basis of silicon-based components.

DE 44 45 553 A1 describes a semiconductor acceleration sensor comprising a semiconductor substrate, a cantilever structure, which is supported by the semiconductor substrate and has a movable electrode arranged at a predetermined distance above the semiconductor substrate, and fixed electrodes arranged on the semiconductor substrate. A sensor section is formed by the movable electrode and the fixed electrodes and detects an acceleration as a result of changes in a current between the fixed electrodes, said changes being brought about by a displacement of the movable electrode associated with the effect of the acceleration on the sensor section.

EP 0 990 911 A1 describes a micromechanical sensor based on the field effect transistor with a movable gate, which is movable in a direction parallel to the substrate surface, wherein the movement of the gate in this direction leads to an enlargement or reduction of the channel region overlapped by the gate in at least one MOSFET.

Micromechanical sensor devices with movable gate usually have evaluation circuits for detecting tiny movements, which theoretically have an excellent signal-to-noise ratio and are therefore suitable for application in e.g. extremely miniaturized acceleration sensors.

FIG. 3 shows a schematic cross-sectional view for elucidating a known micromechanical sensor device with movable gate in vertical cross section.

In FIG. 3, reference sign 2 denotes a silicon substrate, in which a drain region 3, a source region 4 and therebetween a channel region 7 of a field effect transistor are provided. A gate insulation layer 5, for example an oxide layer, is provided on the channel region 7. Surface charges on the insulation layer 5 are indicated by reference sign 6. A movable gate electrode 1 is arranged movably above the substrate 2 in a manner separated by an interspace Z.

A particular feature of a sensor device constructed in this way is the increased noise for deflections in the x,y-direction which is observed in real applications. This increased noise can largely be attributed to parasitic leakage currents.

SUMMARY

The disclosure provides a micromechanical sensor device with movable gate according to the description below and a corresponding production method according to the description below.

The respective descriptions below relate to preferred developments.

The concept underlying the present disclosure resides in the use of an additional oxide region at least at the two longitudinal sides of the channel region, which bring about a reduction of the leakage current for minimizing the thermal noise. By means of the oxide region, induced charges remain restricted on the channel region, and an x,y-displacement of the movable gate results in an optimum change in the channel conductivity. In known sensor devices, parasitic channels are formed in the case of modulated channel overlap, and reduce the sensitivity. As a result of the reduced leakage current according to the present disclosure, the thermal noise of the sensor device decreases, which leads to an improvement in the signal-to-noise ratio (SNR). This fulfillment of the SNR then makes it possible either to produce sensor devices having higher performance or to further miniaturize the sensor core.

In accordance with one preferred development, the oxide region runs in a ring-shaped manner around the drain region, the source region and the channel region. This has the advantage of suppressing a parasitic channel particularly effectively.

In accordance with one preferred development, the channel region is covered by at least one gate insulation layer having a smaller thickness than a depth extent of the oxide region in the substrate.

In accordance with one preferred development, the movable gate is produced from polysilicon. The gate can thus be structured in a simple manner.

In accordance with one preferred development, the oxide region is produced by a LOCOS process or an STI process. The oxide region can thus be defined precisely.

BRIEF DESCRIPTION OF THE DRAWINGS

Further features and advantages of the present disclosure are explained below on the basis of embodiments with reference to the figures.

In the figures:

FIGS. 1a), b) show schematic cross-sectional views for elucidating a micromechanical sensor device with movable gate and a corresponding production method in accordance with one embodiment of the present disclosure, specifically FIG. 1a) in vertical cross section and FIG. 1b) in horizontal cross section along the line A-A' in FIG. 1a);

DETAILED DESCRIPTION

Figure 2:
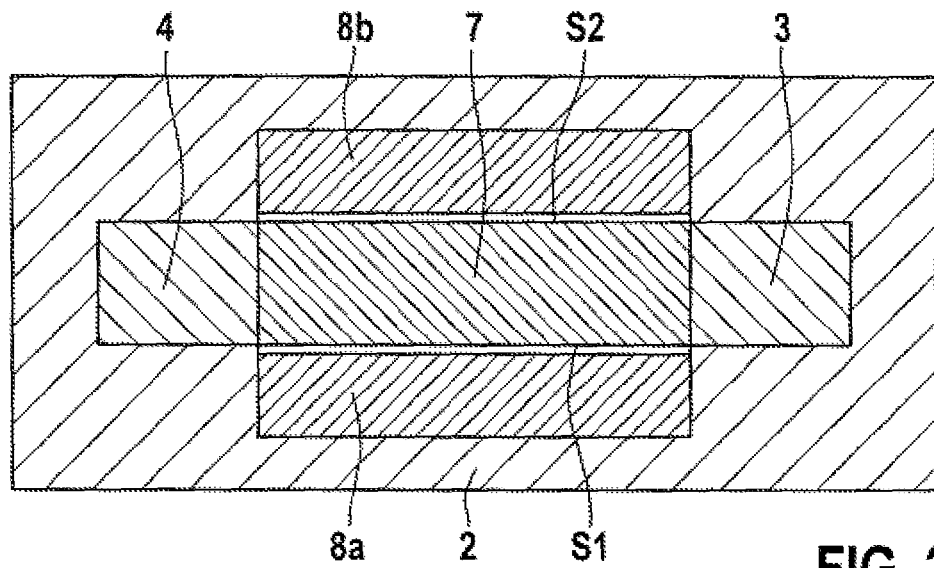
FIG. 2 shows a schematic cross-sectional view for elucidating a micromechanical sensor device with movable gate and a corresponding production method in accordance with a further embodiment of the present disclosure in horizontal cross section analogously to FIG. 1b)

In the figures, identical reference signs designate identical or functionally identical elements.

FIGS. 1a), b) show schematic cross-sectional views for elucidating a micromechanical sensor device with movable gate and a corresponding production method in accordance with one embodiment of the present disclosure, specifically FIG. 1a) in vertical cross section and FIG. 1b) in horizontal cross section along the line A-A' in FIG. 1a).

In FIGS. 1a), b), reference sign 2 denotes a silicon substrate, in which a drain region 3, a source region 4 and therebetween a channel region 7 of a field effect transistor are provided. A gate insulation layer 5, for example an oxide layer, is provided on the channel region 7. Surface charges on the insulation layer 5 are indicated by reference sign 6.

A movable gate electrode 1 is arranged movably above the substrate 2 in a manner separated by an interspace Z.

Figure 3:
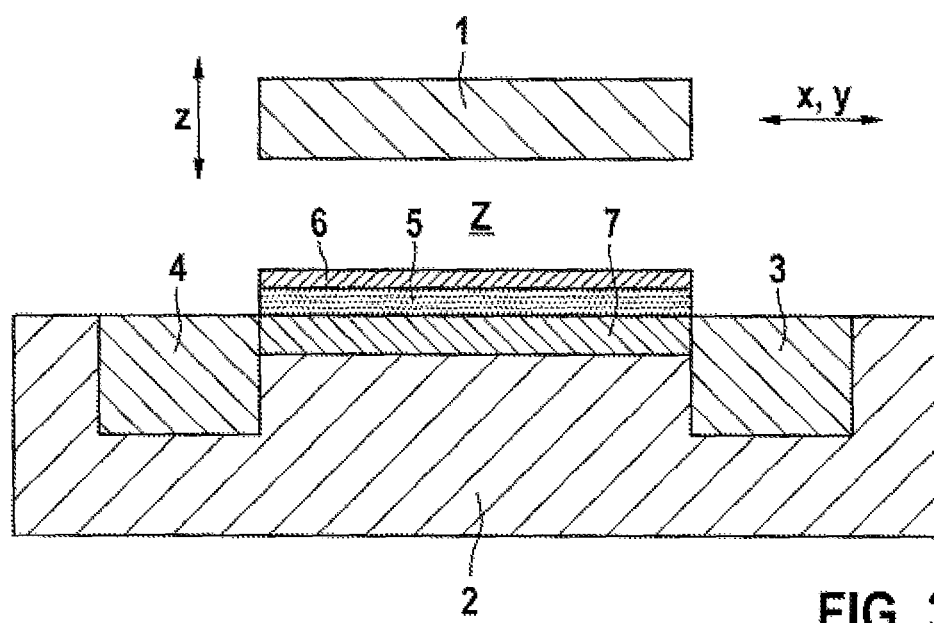
FIG. 3 shows a schematic cross-sectional view for elucidating a known micromechanical sensor device with movable gate in vertical cross section.

In contrast to the above-described known micromechanical sensor device in accordance with FIG. 3, the present embodiment of the disclosure has an oxide region 8 which is provided in the substrate 2 and runs in a ring-shaped manner around the drain region 3, the source region 4 and along the longitudinal sides S1, S2 thereof around the channel region 7 in the substrate.

In the embodiment illustrated, the depth extent of the oxide region 8 is greater than the thickness of the gate insulation layer 5, for example an oxide layer. However, this can be varied in an application-specific manner.

The oxide region (8) can be produced e.g. by means of LOCOS technology by local oxidation of the silicon of the substrate 2. In this case, a thermal oxide is generated outside the geometrical channel definition. Said thermal oxide typically has a thickness of 50-2500 nm, preferably 100-500 nm. This increases the effective gate-channel spacing by a multiple and greatly increases the threshold voltage.

Production can also be effected by means of STI technology (shallow trench isolation). In this case, a depression (trench), the depth of which is typically 50-2500 nm, preferably 100-500 nm, is etched into the silicon of the substrate 2 surrounding the channel region 7 or else into the drain region 3 and the source region 4. Said depression (not illustrated) is subsequently filled with oxide and planarized, which produces the oxide region 8.

When a voltage above the threshold voltage is applied to the movable gate 1, this leads to the formation of a conductive channel region 7. If the drain region 3 and the source region 4 then have a potential difference, a measurable current flows between the two regions. Since the electric field of the gate 1 affects the geometrical region of the channel region not only locally but also outside, this leads to formation of the abovementioned parasitic leakage currents in the case of known micromechanical sensor devices.

The oxide region 8 according to the disclosure, here an oxide ring in accordance with FIG. 1b, brings about an increase in the threshold voltage or a displacement of charge carriers having an identical polarization to the charge carriers in the channel region 7, outside the geometrically defined channel region.

FIG. 2 is a schematic cross-sectional view for elucidating a micromechanical sensor device with movable gate and a corresponding production method in accordance with a further embodiment of the present disclosure in horizontal cross section analogously to FIG. 1b).

In the second embodiment, the oxide region 8a, 8b is not provided as a ring-shaped region, as in the first embodiment, but rather has two strip regions 8a, 8b in the substrate 2, which are arranged parallel to the longitudinal sides S1 and S2, respectively, of the channel region 7 and have approximately the same length as the channel region 7.

Otherwise, the construction of the second embodiment is identical to the construction of the first embodiment described above.

The disclosure can particularly advantageously be applied to structurally small and cost-effective, highly sensitive and robust MEMS sensors, such as, for example, inertial sensors, pressure sensors, imagers, microphones, micromechanical switches, etc.

Although the present disclosure has been described on the basis of preferred exemplary embodiments, it is not restricted thereto. In particular, the abovementioned materials and topologies are merely by way of example and not restricted to the examples explained.

What is claimed is:

1. A micromechanical sensor device with movable gate, the micromechanical sensor device comprising:
    a field effect transistor including a drain region;
    a source region;
    a channel region arranged between the field effect transistor and the source region and including a first doping type, the channel region having longitudinal sides; and
    a movable gate separated from the channel region by an interspace,
    wherein the drain region, the source region, and the channel region are arranged in a substrate, and
    wherein the substrate includes an oxide region at least at the longitudinal sides of the channel region.

2. The micromechanical sensor device according to claim 1, wherein the oxide region runs in a ring-shaped manner around the drain region, the source region, and the channel region in the substrate.

3. The micromechanical sensor device according to claim 1, wherein the channel region is covered by at least one gate insulation layer having a smaller thickness than a depth extent of the oxide region in the substrate.

4. The micromechanical sensor device according to claim 1, wherein the movable gate is produced from polysilicon.

5. A method for producing a micromechanical sensor device with a movable gate, the method comprising:
    forming a field effect transistor having a drain region, a source region, a channel region arranged between the drain region and the source region and including a first doping type, and a movable gate separated from the channel region by an interspace, wherein the drain region, the source region, and the channel region are arranged in a substrate; and
    providing an oxide region in the substrate at least at longitudinal sides of the channel region.

6. The method according to claim 5, wherein the oxide region is produced by a LOCOS process or an STI process.

* * * * *